(12) United States Patent
Bevis

(10) Patent No.: US 9,607,802 B2
(45) Date of Patent: *Mar. 28, 2017

(54) APPARATUS AND METHODS FOR ABERRATION CORRECTION IN ELECTRON BEAM BASED SYSTEM

(71) Applicant: KLA-Tencor Corporation, Milpitas, CA (US)

(72) Inventor: Christopher F. Bevis, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/567,785

(22) Filed: Dec. 11, 2014

(65) Prior Publication Data

US 2016/0172151 A1    Jun. 16, 2016

Related U.S. Application Data

(63) Continuation of application No. 13/287,682, filed on Nov. 2, 2011, now Pat. No. 8,933,425.

(51) Int. Cl.
*H01J 37/153* (2006.01)
*H01J 37/317* (2006.01)
*H01J 37/30* (2006.01)

(52) U.S. Cl.
CPC ........ *H01J 37/153* (2013.01); *H01J 37/3007* (2013.01); *H01J 37/3174* (2013.01); *H01J 37/3175* (2013.01); *H01J 2237/0435* (2013.01); *H01J 2237/1534* (2013.01); *H01J 2237/303* (2013.01); *H01J 2237/3175* (2013.01); *H01J 2237/31774* (2013.01); *H01J 2237/31788* (2013.01); *H01J 2237/31789* (2013.01)

(58) Field of Classification Search
None
See application file for complete search history.

(56) References Cited

U.S. PATENT DOCUMENTS 4,418,283 A    11/1983  Trotel
4,523,971 A *  6/1985  Cuomo ................ C23C 14/46
                                                    118/50.1

(Continued)

FOREIGN PATENT DOCUMENTS

EP          1 139 384 A2    10/2001

*Primary Examiner* — Wyatt Stoffa
*Assistant Examiner* — James Choi
(74) *Attorney, Agent, or Firm* — Okamoto & Benedicto LLP

(57) ABSTRACT

One embodiment relates to an apparatus for aberration correction in an electron beam lithography system. An inner electrode surrounds a pattern generating device, and there is at least one outer electrode around the inner electrode. Each of the inner and outer electrodes has a planar surface in a plane of the pattern generating device. Circuitry is configured to apply an inner voltage level to the inner electrode and at least one outer voltage level to the at least one outer electrode. The voltage levels may be set to correct a curvature of field in the electron beam lithography system. Another embodiment relates to an apparatus for aberration correction used in an electron based system, such as an electron beam inspection, or review, or metrology system. Other embodiments, aspects and features are also disclosed.

18 Claims, 10 Drawing Sheets

800    (Pupil or Image Plane)

(56) References Cited

U.S. PATENT DOCUMENTS

| | | |
|---|---|---|
| 5,172,035 A | 12/1992 | Sakurai et al. |
| 5,258,246 A | 11/1993 | Berger et al. |
| 5,466,904 A | 11/1995 | Pfeiffer et al. |
| 5,545,902 A | 8/1996 | Pfeiffer et al. |
| 5,633,507 A | 5/1997 | Pfeiffer et al. |
| 5,798,524 A | 8/1998 | Kundmann et al. |
| 5,905,331 A | 5/1999 | Misono |
| 7,060,986 B2 | 6/2006 | Nakamura et al. |
| 7,214,951 B2 | 5/2007 | Stengl et al. |
| 7,244,932 B2 | 7/2007 | Nakasuji et al. |
| 7,439,502 B2 | 10/2008 | Nakasuji et al. |
| 7,446,601 B2 | 11/2008 | LeChevalier |
| 7,671,687 B2 | 3/2010 | LeChevalier |
| 7,863,580 B2 | 1/2011 | Hatakeyama et al. |
| 8,173,963 B2 | 5/2012 | Schroder et al. |
| 8,183,526 B1 | 5/2012 | Mankos |
| 8,618,496 B2 | 12/2013 | Wieland et al. |
| 8,933,425 B1 | 1/2015 | Bevis |
| 2002/0148961 A1 | 10/2002 | Nakasuji et al. |
| 2004/0081283 A1 | 4/2004 | Rand |
| 2005/0140831 A1 | 6/2005 | Yoon et al. |
| 2005/0247884 A1 | 11/2005 | Nakamura et al. |
| 2005/0264782 A1 | 12/2005 | Ryzhikov et al. |
| 2005/0285541 A1* | 12/2005 | LeChevalier ............ H01J 21/24 315/169.3 |
| 2007/0029506 A1 | 2/2007 | Zywno et al. |
| 2007/0158567 A1 | 7/2007 | Nakamura et al. |
| 2007/0272859 A1 | 11/2007 | Nakasuji et al. |
| 2008/0067377 A1 | 3/2008 | Hatakeyama et al. |
| 2008/0173815 A1 | 7/2008 | Nakasuji et al. |
| 2008/0230711 A1* | 9/2008 | Platzgummer ......... B82Y 10/00 250/396 R |
| 2009/0014649 A1 | 1/2009 | Nakasuji et al. |
| 2009/0026389 A1* | 1/2009 | Platzgummer ......... B82Y 10/00 250/492.2 |
| 2010/0001202 A1 | 1/2010 | Matsuda et al. |
| 2010/0224781 A1 | 9/2010 | Hosokawa |
| 2012/0104252 A1* | 5/2012 | Knippelmeyer ....... B82Y 10/00 250/307 |

\* cited by examiner (Cross Section)

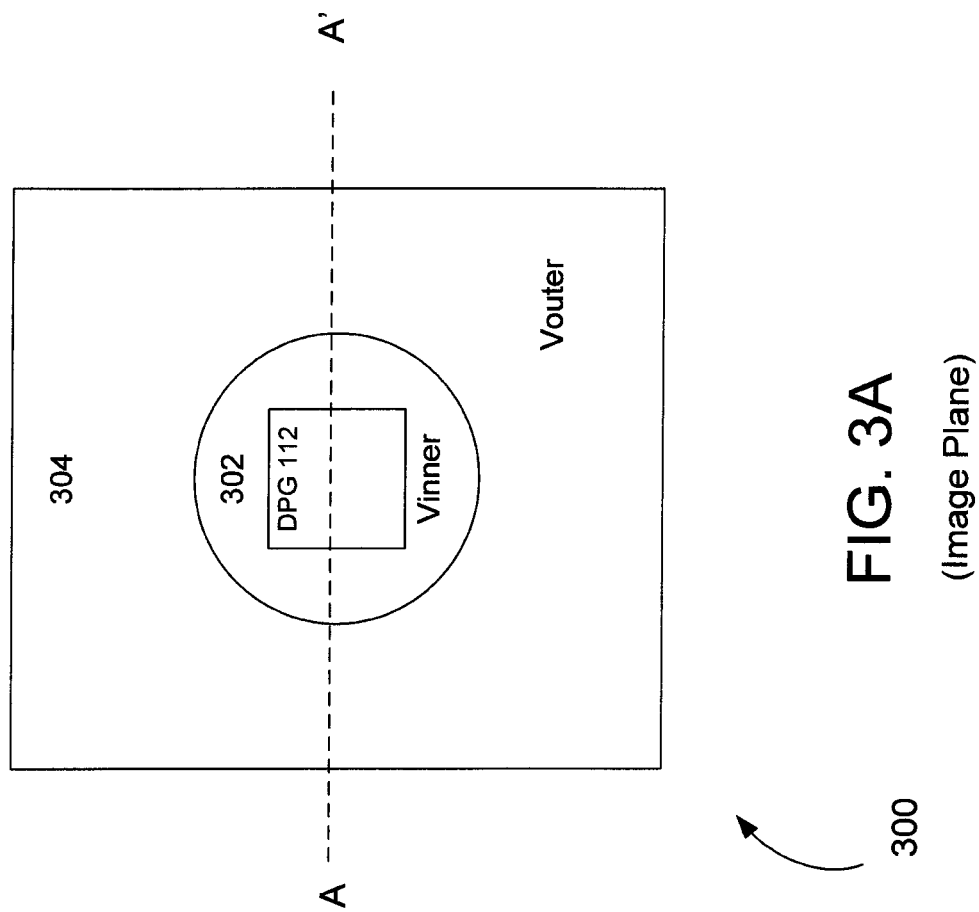

(Cross Section A-A')

(Image Plane)

(Pupil Plane)

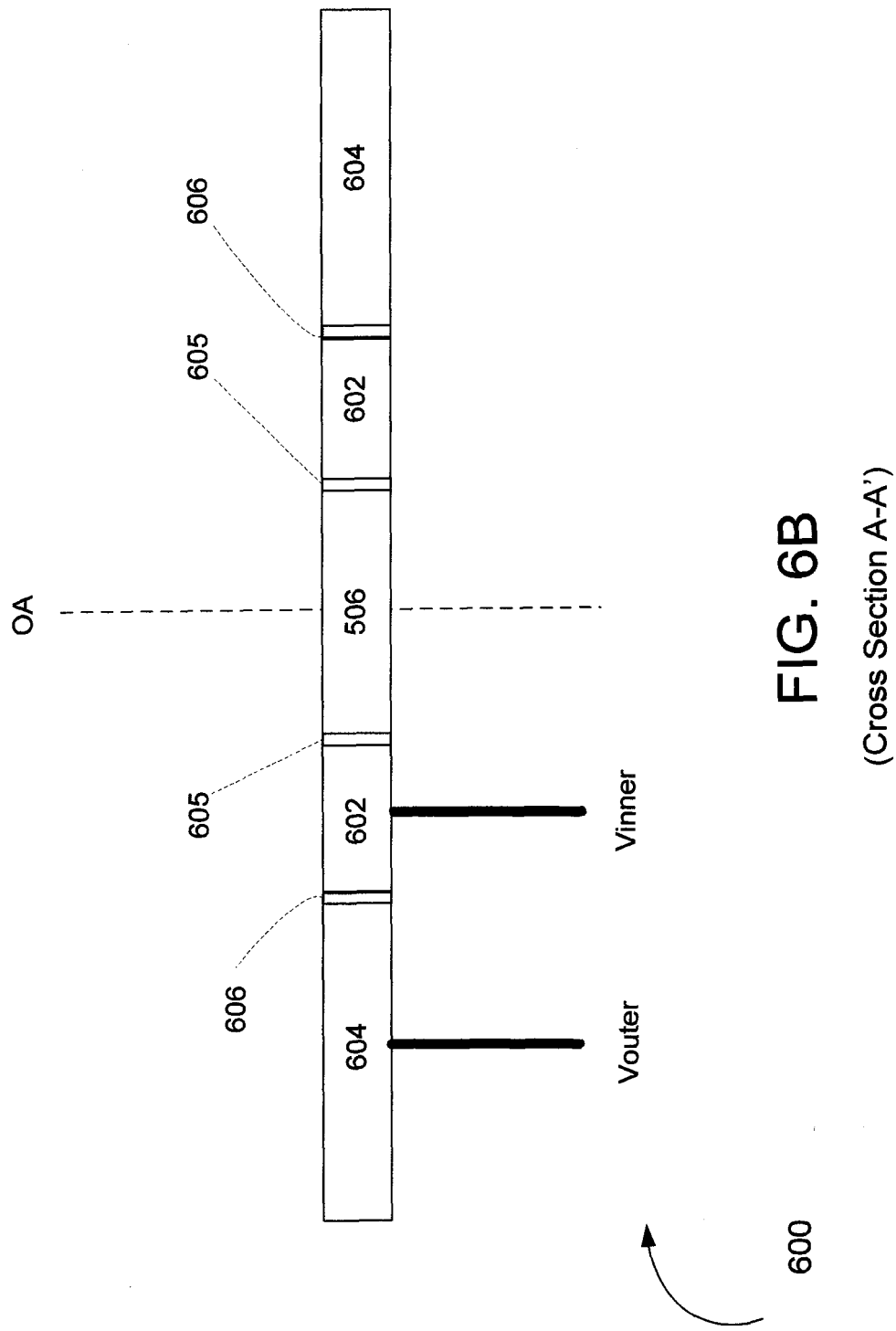

(Pupil Plane)

(Pupil or Image Plane)

APPARATUS AND METHODS FOR ABERRATION CORRECTION IN ELECTRON BEAM BASED SYSTEM

CROSS-REFERENCE TO RELATED APPLICATION(S)

The present application is a continuation of U.S. patent application Ser. No. 13/287,682, filed Nov. 2, 2011, the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND

Technical Field

The present invention relates generally to semiconductor manufacturing and related technologies. More particularly, the present invention relates to electron beam lithography systems and other electron beam based systems.

Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed.

In general, electron beam lithographic systems may be designed to operate in either a reflection mode or a transmission mode. In a reflection mode, the electron beam is patterned by reflecting the beam from a selectively reflective array. If the pattern on the reflective array is dynamically changeable, then the array may be referred to as a dynamic pattern generator (DPG). In a transmission mode, the electron beam is patterned by transmitting the beam through a blanker array.

The electron-optical elements of electron beam lithographic systems generally cause imaging aberrations which need to be corrected. Aberration correction is typically performed using multi-pole elements. However, the multi-pole elements used for aberration correction are typically large and expensive and are limited as to which aberrations can be corrected.

It is highly desirable to improve lithography systems. The present disclosure provides advantageous apparatus and methods for correcting aberrations in an electron beam lithography system.

BRIEF DESCRIPTION OF THE DRAWINGS

FIG. 3A is a planar view of an aberration correction apparatus for a reflection-mode system in accordance with an embodiment of the invention.

FIG. 6B is a cross-sectional view of an aberration correction apparatus for a transmission-mode system in accordance with an embodiment of the invention.

SUMMARY

Figure 1:
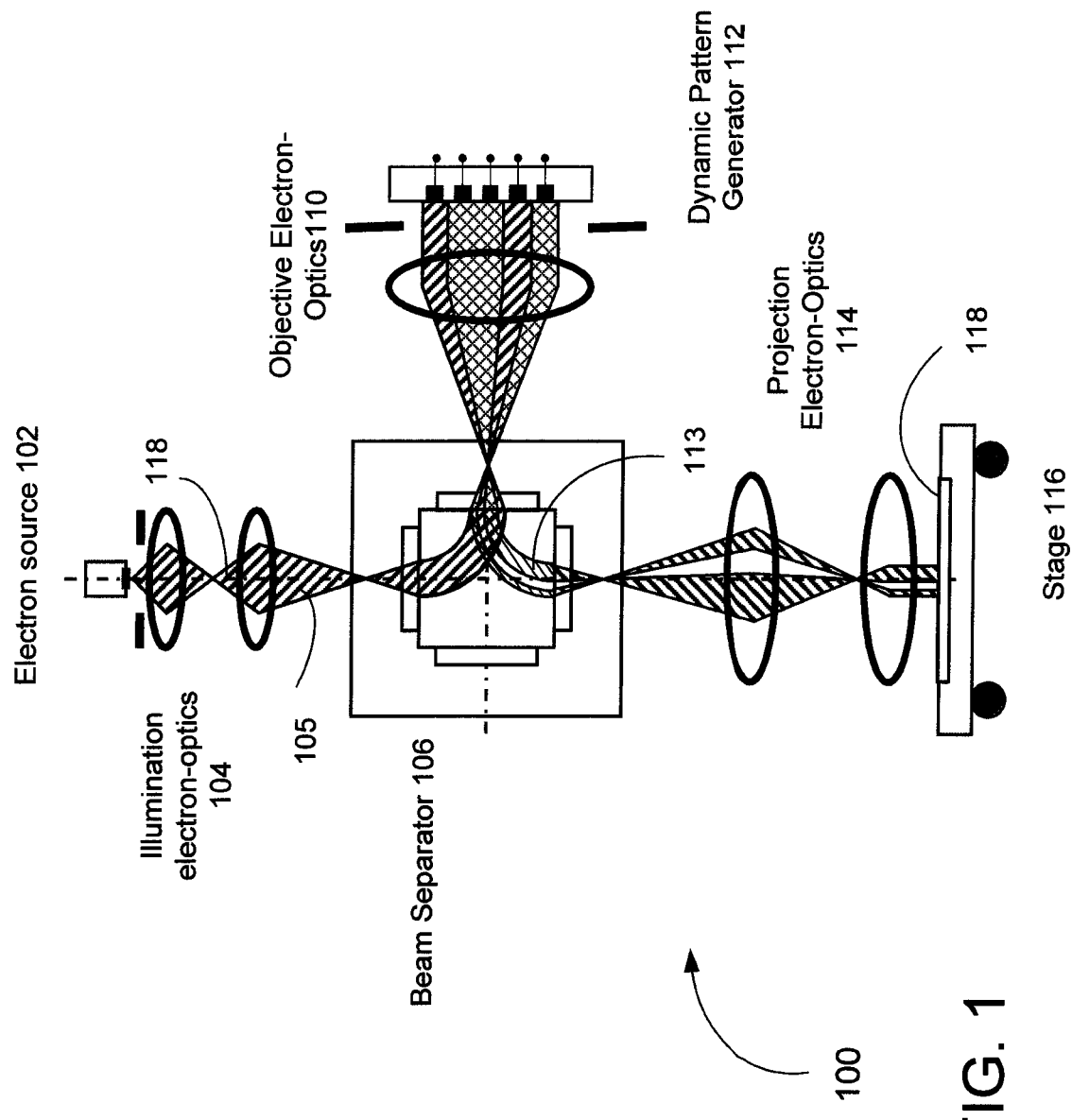
FIG. 1 is a schematic diagram of a reflection-mode electron beam lithography system in accordance with an embodiment of the invention.

One embodiment relates to an apparatus for aberration correction in an electron beam lithography system. An inner electrode surrounds a pattern generating device, and there is at least one outer electrode around the inner electrode. Each of the inner and outer electrodes has a planar surface in a plane of the pattern generating device. Circuitry is configured to apply an inner voltage level to the inner electrode and at least one outer voltage level to the at least one outer electrode. The voltage levels may be set to correct a curvature of field in the electron beam lithography system.

Another embodiment relates to an electron beam lithography system. The system includes at least an electron source, illumination electron-optics, a pattern generating device, projection electron-optics, and a target substrate. An inner electrode is configured to surround the pattern generating device, and at least one outer electrode is configured around the inner electrode. Each of the inner and outer electrodes has a planar surface in a plane of the pattern generating device. Circuitry is configured to apply an inner voltage level to the inner electrode and at least one outer voltage level to the at least one outer electrode.

Another embodiment relates to a method of correcting aberration in an electron beam lithography system. Adjustment is made to an inner voltage level applied to an inner electrode surrounding a pattern generating device, where the inner electrode has a planar surface in a plane of the pattern generating device. Adjustment is also made to at least one outer voltage level which is applied to at least one outer electrode around the inner electrode, where the at least one outer electrode also has a planar surface in the plane of the pattern generating device.

Another embodiment relates to an apparatus for aberration correction in an electron beam based system. An inner electrode surrounds an opening or reflector, and there is at least one outer electrode around the inner electrode. Each of the inner and outer electrodes has a planar surface in a plane of the opening or reflector. Circuitry is configured to apply an inner voltage level to the inner electrode and at least one outer voltage level to the at least one outer electrode. The voltage levels may be set to correct a curvature of field in the electron beam based system.

Another embodiment relates to a method of correcting aberration in an electron beam based system. Adjustment is made to an inner voltage level applied to an inner electrode surrounding an opening or reflector, where the inner electrode has a planar surface in a plane of the opening or reflector. Adjustment is also made to at least one outer voltage level which is applied to at least one outer electrode around the inner electrode, where the at least one outer electrode also has a planar surface in the plane of the opening or reflector.

Other embodiments, aspects and features are also disclosed.

DETAILED DESCRIPTION

The present disclosure provides apparatus and methods for the advantageous correction of aberrations in an electron beam lithography system. In accordance with embodiments of the invention, curvature of field and higher-order aberrations may be corrected without adding to the electron-optical path length. This allows for lower coulomb interaction in the projection arm of the system.

In accordance with one embodiment of the invention, the apparatus and methods may be advantageously applied to an electron beam projection system operating in a reflection mode. In accordance with another embodiment of the invention, the apparatus and methods may be advantageously applied to a an electron beam projection system operating in a transmission mode.

Reflection-Mode System

An example of an electron beam lithography system designed to operate in a reflection mode is depicted in FIG. 1. While FIG. 1 shows one example of a reflection-mode electron beam system, it is contemplated that the apparatus and methods of the present invention are applicable in a wide variety of reflection-mode electron beam systems.

As depicted in FIG. 1, the example reflection-mode electron beam lithography system 100 includes an electron source 102, illumination electron-optics 104, a beam separator 106, an objective electron lens 110, a dynamic pattern generator (DPG) 112, projection electron-optics 114, and a stage 116 for holding a semiconductor wafer or other target substrate 118 to be lithographically patterned.

The illumination electron-optics 104 is configured to focus and collimate the electron beam from the electron source 102. The illumination electron-optics 104 may comprise an arrangement of magnetic and/or electrostatic lenses and allows the setting of the current illuminating the DPG 112.

The beam separator 106 may be configured to receive the incident electron beam 105 from the illumination electron-optics 104. In one implementation, the beam separator 106 comprises a magnetic prism. When the incident beam 105 travels through the magnetic fields of the prism, its trajectory is bent towards the objective electron-optics 110. The objective electron-optics 110 receives the incident beam from the separator 106 and decelerates and focuses the incident electrons as they approach the DPG 112.

The DPG 112 may include a two-dimensional array of pixels. As one example, the dimensions of the array may be 4096×248 pixels. Various other dimensions of the array may also be implemented. As described further below in relation to FIG. 2, each pixel may comprise a multiple-electrode electron reflector to which voltage levels are controllably applied. By setting the applied voltage levels, each pixel may be set to one of two modes. In a first mode, the pixel may reflect a focused beamlet of electrons. In a second mode, the pixel may absorb or scatter electrons such that no focused beamlet of electrons is reflected from that pixel. By setting only select pixels to reflect a focused beamlet, a patterned electron beam 113 may be generated by selective reflection from the DPG 112.

The objective electron-optics 110 accelerates the patterned electron beam 113 such that it passes the beam separator 106. The beam separator 106 bends the trajectory of the patterned electron beam 113 towards the projection electron-optics 114. The projection electron-optics 114 may comprise an arrangement of magnetic and/or electrostatic lenses. The projection electron-optics 114 may be configured to focus and de-magnify (shrink) the patterned electron beam 113 such that it is projected onto photoresist on a semiconductor wafer or onto other target substrate 118.

The stage 116 holds the target semiconductor wafer or other target substrate 118. Depending on the implementation, the stage 116 may be stationary or in motion during the lithographic projection. In the case where the stage 116 is moving, the pattern on the DPG 112 may be dynamically adjusted to compensate for the motion such that the projected pattern moves in correspondence with the wafer movement.

While FIG. 1 depicts an example reflection-mode system within which an embodiment of the invention may be implemented, embodiments of the invention may be implemented within other reflection-mode systems as well.

Figure 2:
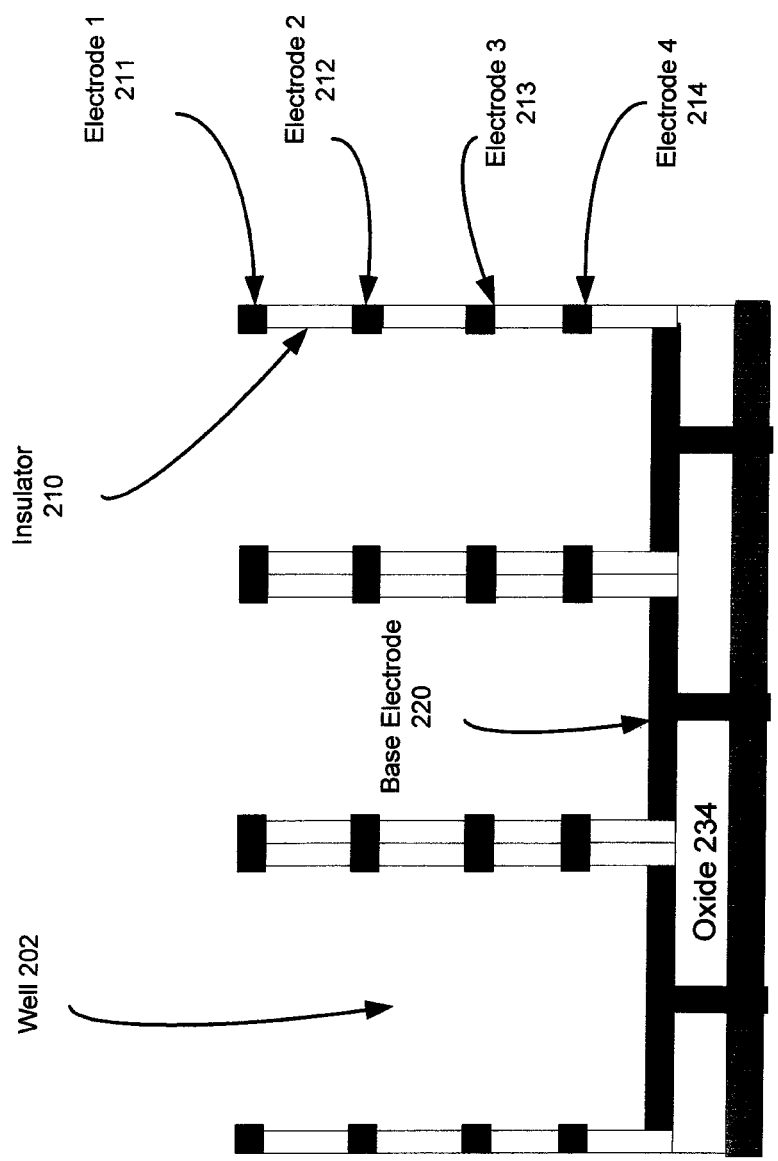
FIG. 2 is a cross-sectional diagram of a multiple-electrode reflector structure for a dynamic pattern generator in accordance with an embodiment of the invention.

Further in regard to the multiple-electrode electron reflector which may be used for pixels of the DPG 112, a cross-sectional diagram showing an example reflector structure is provided in FIG. 2. As shown, the sidewalls surrounding the opening of each pixel well (cup) 202 comprises a stack with multiple conductive layers or electrodes (for example, 211, 212, 213, and 214) separated by insulating layers 210. In addition, each well includes a base electrode 220 at the bottom of each well 202.

The well 202 may be of a cylindrical shape such that the opening at the top and the base electrode 220 at the bottom are circular. For example, each well 202 may have a diameter of 1.5 microns and may be 4 microns deep. The stacked electrode well structure may be fabricated on a silicon substrate 232 with an oxide layer 234 on the substrate. A CMOS circuit below the wells 202 may be used to apply the voltages to the multiple electrode layers.

Aberration Correction Apparatus for Reflection-Mode System

FIG. 3A is a planar view of an aberration correction apparatus 300 for a reflection-mode system 100 in accordance with an embodiment of the invention. More particularly, the planar view shows the aberration correction apparatus 300 at the image plane at the DPG 112 of the reflection-mode system 100. As shown, in the image plane, the DPG 112 is surrounded by an inner electrode 302, and the inner electrode 302 is, in turn, surrounded by an outer electrode 304. A first voltage level Vinner may be applied to the inner electrode 302, and a second voltage level Vouter may be applied to the outer electrode 304.

In the embodiment depicted in FIG. 3A, the outer perimeter of the inner electrode 302 in the image plane may be circular and centered on the electron-optical axis of the system. As further depicted, the outer perimeter of the outer electrode 304 in the image plane may be square and centered on the electron-optical axis of the system. Other shapes of the inner electrode 302 and the outer electrode 304 in the image plane are also contemplated to be within the scope of the presently-disclosed invention. For example, in another embodiment, the outer perimeter of both electrodes may be circular. In yet another embodiment, the outer perimeter of both electrodes may be square. In yet another embodiment, the outer perimeter of the inner electrode 302 may be square, and the outer perimeter of the outer electrode 304 may be circular.

Figure 3B:
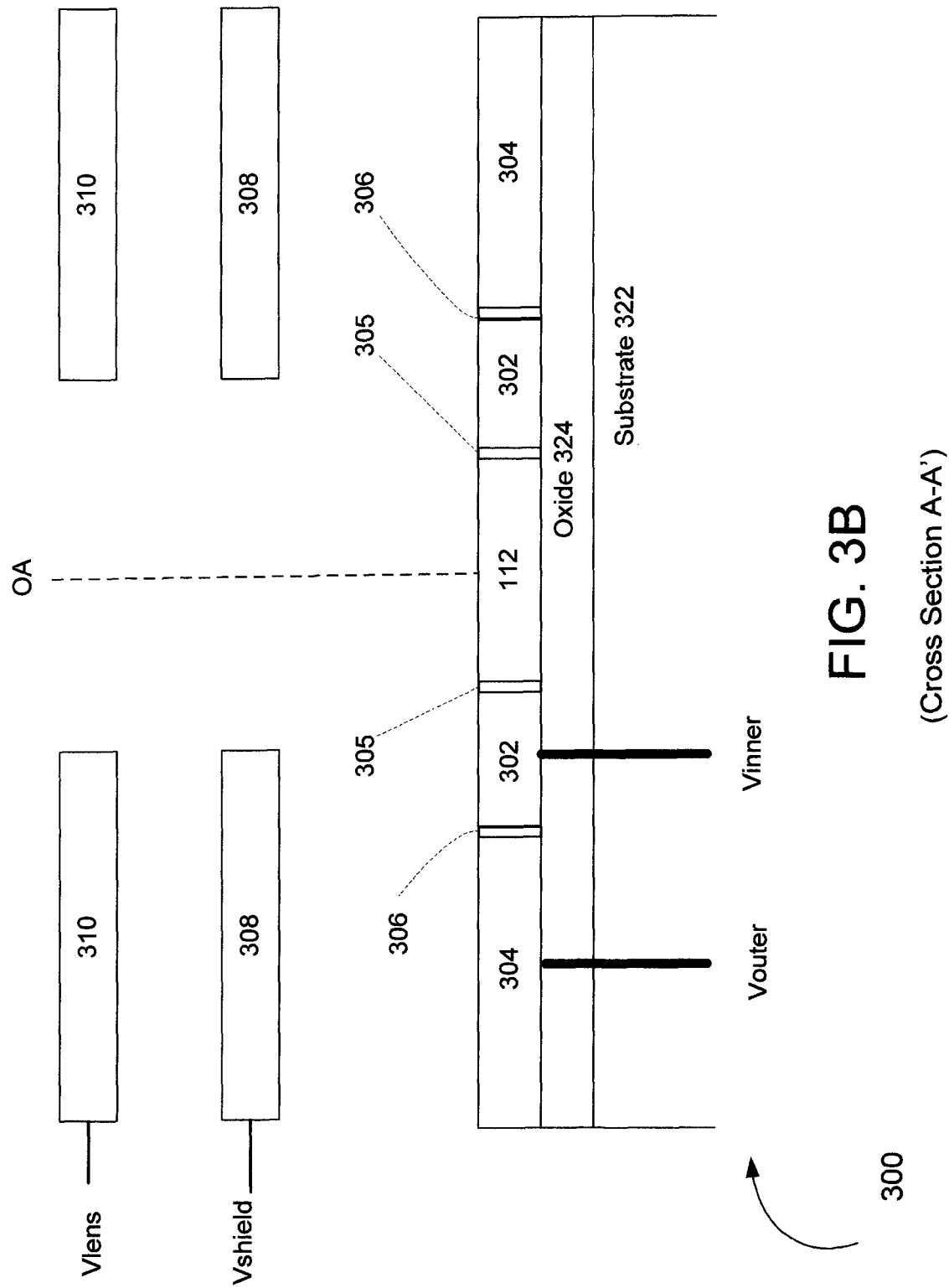
FIG. 3B is a cross-sectional view of an aberration correction apparatus for a reflection-mode system in accordance with an embodiment of the invention.

FIG. 3B depicts a cross-sectional view of an aberration correction apparatus 300 for a reflection-mode system in accordance with an embodiment of the invention. The cross section depicted is of the A-A' plane shown in FIG. 3A. The optical axis (OA) of the system is shown as going to a center of the DPG 112. As depicted, the inner and outer electrodes (302 and 304) may be formed on an oxide layer 324 over a semiconductor substrate 322. The voltage levels Vinner and Vouter may be applied via conductive conduits which go through the oxide layer 324 to the inner and outer electrodes (302 and 304). In addition, there may be an insulating border (for example, of oxide) 305 between the DPG 112 and the inner electrode 302 and an insulating border 306 between the inner and outer electrodes (302 and 304). Further shown in FIG. 3B are a shield electrode 308 above the DPG 112 and a bottom lens electrode 310 of an electrostatic lens in the objective electron-optics 110. A shield voltage level, Vshield, may be applied to the shield electrode 308, and a lens voltage level, Vlens, may be applied to the bottom lens electrode 310.

In accordance with an embodiment of the invention, the inner and outer voltage levels (Vinner and Vouter, respectively) are set so as to correct for curvature of field aberrations in the electron-optics. In particular, the Vinner and Vouter are set so as to modify the field distribution of the lens formed by the bottom lens electrode 310, the shield electrode 308, and the top electrode 211 of the DPG 112. The field distribution is modified so as to reduce aberrations of the overall electron-optical system.

Figure 4:
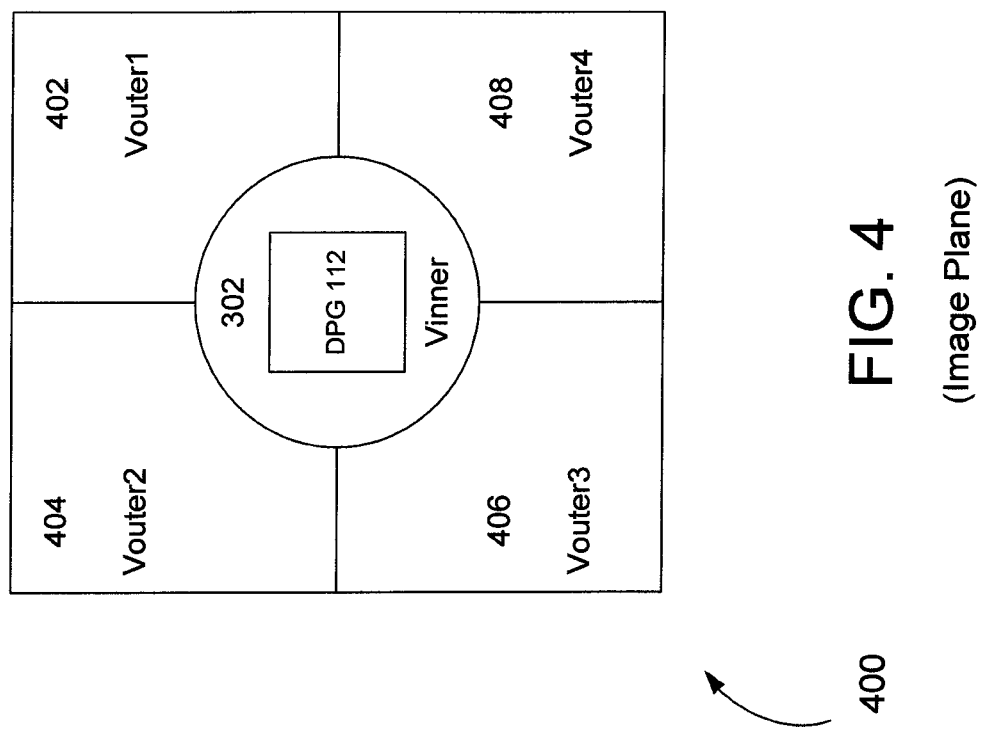
FIG. 4 is a planar view of an aberration correction apparatus for a reflection-mode system in accordance with another embodiment of the invention.

FIG. 4 is a planar view of an aberration correction apparatus 400 for a reflection-mode system in accordance with another embodiment of the invention. In this embodiment, instead of one inner electrode 302 and one outer electrode 304, there is one inner electrode 302 and four outer electrodes (402, 404, 406 and 408). In this case, the four outer electrodes (402, 404, 406 and 408) are arranged in four quadrants around the inner electrode 302. In this embodiment, five separately controllable voltages (Vinner, Vouter1, Vouter2, Vouter3 and Vouter4) are applied to the five electrodes (302, 402, 404, 406 and 408, respectively). The five voltages may be set so as to correct for curvature of field aberrations and higher-order aberrations in the electron-optics.

Transmission-Mode System

Figure 5:
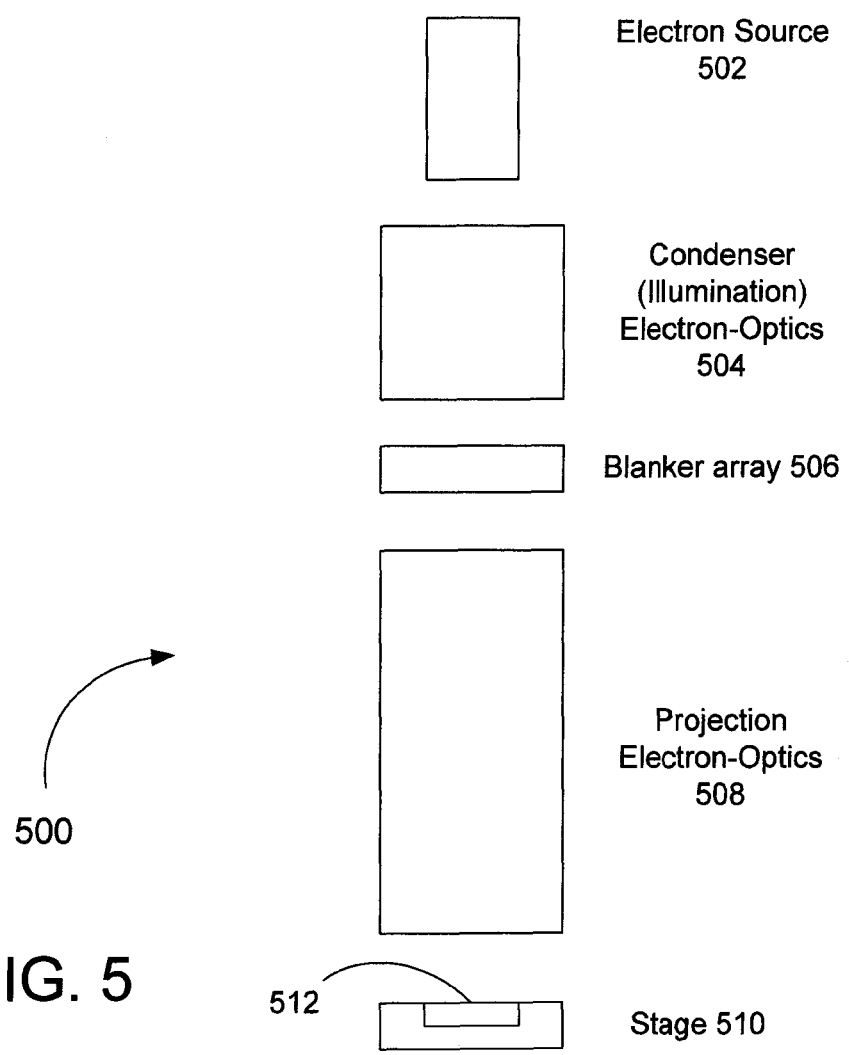
FIG. 5 is a simplified block diagram of a transmission-mode electron beam lithography system in accordance with an embodiment of the invention.

FIG. 5 is a simplified block diagram of a transmission-mode electron beam lithography system 500 in accordance with an embodiment of the invention. As shown, the system 500 may include an electron source 502, condenser electron-optics 504, a blanker array 506, projection electron-optics 508, and a stage 510 for holding a target substrate 512.

The condenser (or illumination) electron-optics 504 may be an arrangement of magnetic and/or electrostatic lenses which focuses and collimates the electron beam from the electron source 502. In addition, the condenser electron-optics 504 allows the setting of the current illuminating the blanker array 506.

The blanker array 506 may include a two-dimensional array of pixels. Various dimensions of the array may be implemented. Each pixel may be separately controlled to either allow transmission of an electron beamlet, or to block transmission of the electron beamlet (i.e. to "blank" the beamlet for the pixel). By setting only select pixels to transmit a beamlet, a patterned electron beam may be transmitted by the blanker array 506.

The projects electron-optics 508 may be an arrangement of magnetic and/or electrostatic lenses which projects and de-magnifies (shrinks) the electron beam onto the surface of the target substrate 512. The target substrate 512 may be held by a stage 510. Depending on the implementation, the stage 510 may be stationary or in motion during the lithographic projection. In the case where the stage 510 is moving, the pattern on the blanker array 506 may be dynamically adjusted to compensate for the motion such that the projected pattern moves in correspondence with the movement of the target substrate.

Aberration Correction Apparatus for Transmission-Mode System

Figure 6A:
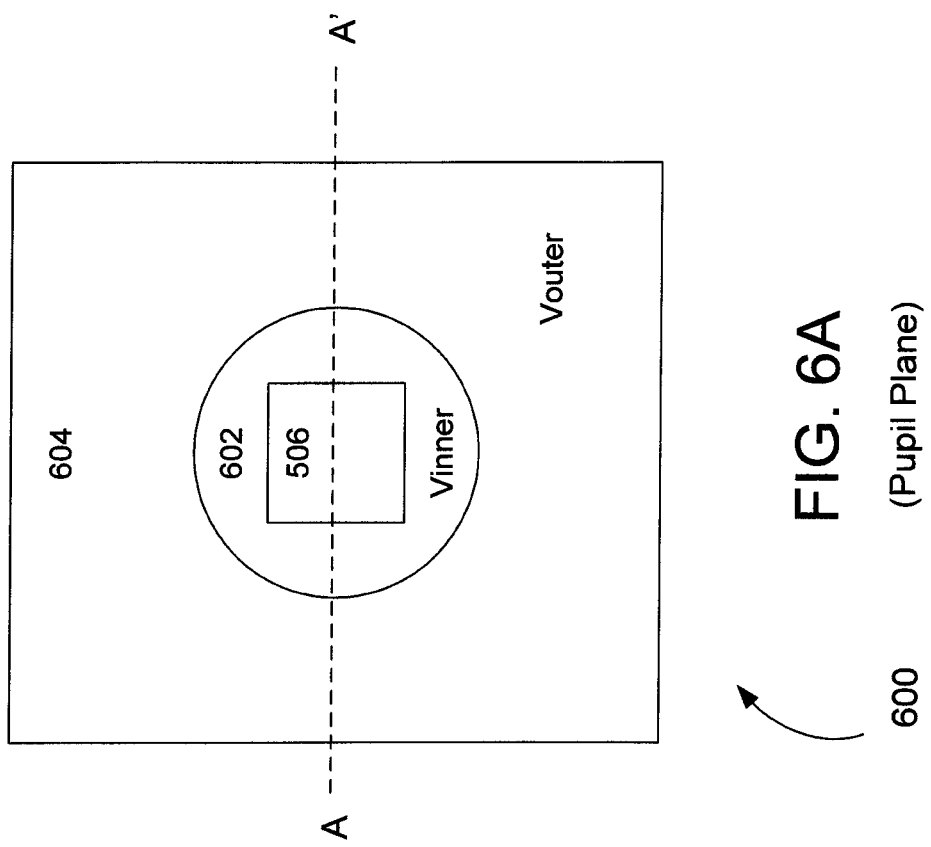
FIG. 6A is a planar view of an aberration correction apparatus for a transmission-mode system in accordance with an embodiment of the invention.

FIG. 6A is a planar view of an aberration correction apparatus for a transmission-mode system in accordance with an embodiment of the invention. More particularly, the planar view shows the aberration correction apparatus 600 at the pupil plane at the blanker array 506 of the reflection-mode system 500.

As shown, in the pupil plane, the blanker array 506 may be surrounded by an inner electrode 602, and athe inner electrode 302 may be, in turn, surrounded by an outer electrode 604. A first voltage level Vinner may be applied to the inner electrode 602, and a second voltage level Vouter may be applied to the outer electrode 604.

In the embodiment depicted in FIG. 6A, the outer perimeter of the inner electrode 602 in the pupil plane may be circular and centered on the electron-optical axis of the system. As further depicted, the outer perimeter of the outer electrode 604 in the pupil plane may be square and centered on the electron-optical axis of the system. Other shapes of the inner electrode 602 and the outer electrode 604 in the pupil plane are also contemplated to be within the scope of the presently-disclosed invention. For example, in another embodiment, the outer perimeter of both electrodes may be circular. In yet another embodiment, the outer perimeter of both electrodes may be square. In yet another embodiment, the outer perimeter of the inner electrode 602 may be square, and the outer perimeter of the outer electrode 604 may be circular.

FIG. 6B is a cross-sectional view of an aberration correction apparatus for a transmission-mode system in accordance with an embodiment of the invention. The cross section depicted is of the A-A' plane shown in FIG. 6A. The optical axis (OA) of the system is shown as going through a center of the blanker array 506. As depicted, there may be an insulating border (for example, of oxide) 605 between the blanker array 506 and the inner electrode 602 and an insulating border 606 between the inner and outer electrodes (602 and 604). In addition, the voltage levels Vinner and Vouter may be applied, respectively, to the inner and outer electrodes (602 and 604).

Figure 7:
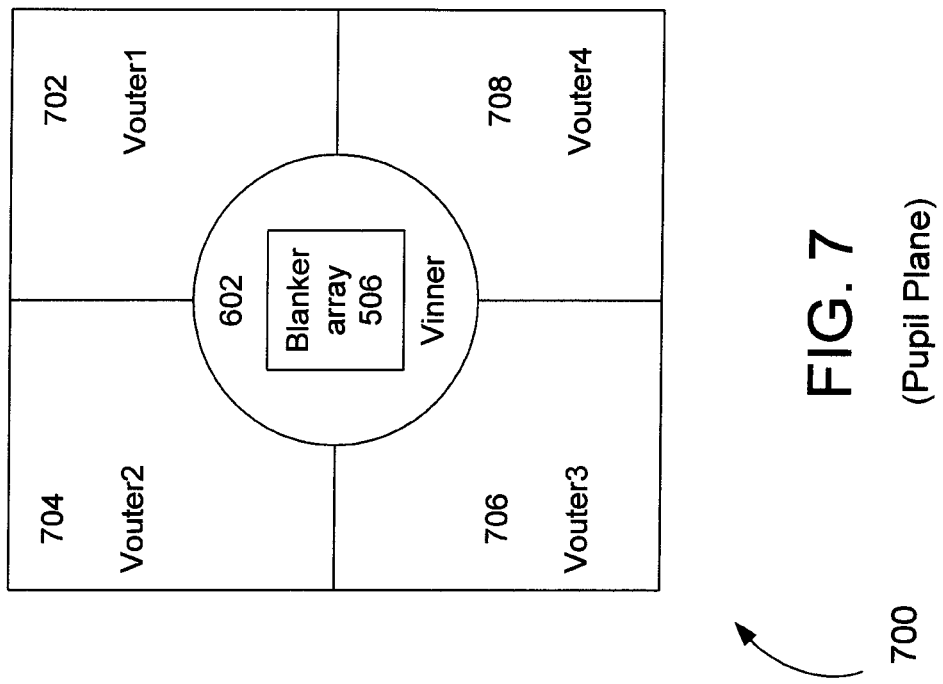
FIG. 7 is a planar view of an aberration correction apparatus for a transmission-mode system in accordance with another embodiment of the invention.

FIG. 7 is a planar view of an aberration correction apparatus for a transmission-mode system in accordance with another embodiment of the invention. In this embodiment, instead of one inner electrode 602 and one outer electrode 604, there is one inner electrode 602 and four outer electrodes (702, 704, 706 and 708). In this case, the four outer electrodes (702, 704, 706 and 708) are arranged in four quadrants around the inner electrode 602. In this embodiment, five separately controllable voltages (Vinner, Vouter1, Vouter2, Vouter3 and Vouter4) are applied to the five electrodes (602, 702, 704, 706 and 708, respectively). The five voltages may be set so as to correct for curvature of field aberrations and higher-order aberrations in the electron-optics.

Figure 8:
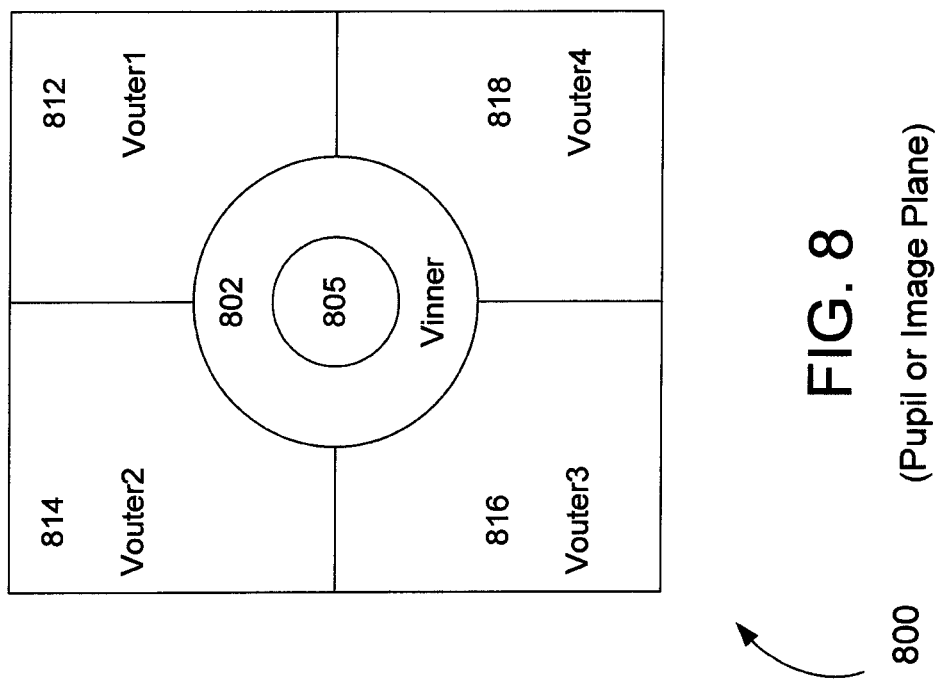
FIG. 8 is a planar view of an apparatus used to correct aberration in an electron beam based system in accordance with an embodiment of the invention.

In another embodiment of the invention, the aberration correction apparatus may be used more generally in electron beam based systems, including systems utilized for electron beam inspection, or defect review, or metrology. For such an apparatus, the inner electrode may surround either an opening through which an electron beam passes, or a mirror electrode reflector which reflects the electron beam (instead of, a blanker array 506 or a DPG 112, respectively, in the above-described lithography systems). The apparatus may be operated to reduce aberration in the electron beam based system. An example of such an apparatus 800 is shown in FIG. 8, where a circular-shaped opening or reflector 805 is shown within the inner electrode 802, and four outer electrodes 812, 814, 816, and 818 are shown surrounding the inner electrode 802. The plane shown in the figure would be a pupil plane if the inner electrode surrounds an opening and would be an image plane if the inner electrode surrounds a reflector.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for aberration correction in electron-optics of an electron beam system, the apparatus comprising:
   an inner electrode surrounding an opening in the electron-optics, the inner electrode having a continuous annular planar surface extending unbroken from a circular inner perimeter to a circular outer perimeter in a plane of the opening;
   at least one outer electrode around the inner electrode, the at least one outer electrode having a planar surface in the plane of the opening;
   circuitry configured to apply an inner voltage level to the inner electrode and at least one outer voltage level to the at least one outer electrode; and
   a blanker array within the opening which receives an incident electron beam and generates multiple beamlets of electrons,
   wherein the inner voltage level and the at least one outer voltage levels, as applied to said electrodes, each causes an electric field that influences both electrons of the incident electron beam that are incident to the opening and the multiple beamlets of electrons outgoing from the opening.

2. The apparatus of claim 1, wherein each of the inner voltage level and the at least one outer voltage level are controlled individually.

3. The apparatus of claim 2, wherein the inner voltage level and the at least one outer voltage level are set to correct a curvature of field in the electron-optics.

4. The apparatus of claim 1, wherein the inner electrode is centered on an optical axis of the electron-optics.

5. The apparatus of claim 1, wherein the at least one outer electrode is a single outer electrode which is centered on an optical axis.

6. The apparatus of claim 1, wherein the at least one outer electrode comprises a plurality of outer electrodes.

7. The apparatus of claim 1, wherein the at least one outer electrode comprises four electrodes which are arranged in quadrants around the inner electrode.

8. The apparatus of claim 7, wherein the inner voltage level and the at least one outer voltage level are set to correct a curvature of field and higher-order aberrations in the electron-optics.

9. The apparatus of claim 1, wherein the planar surfaces of the inner electrode and the at least one outer electrode are in an image plane of the electron-optics.

10. The apparatus of claim 1, wherein the planar surfaces of the inner electrode and the at least one outer electrode are in a pupil plane of the electron-optics.

11. A method of correcting aberration in electron-optics of an electron beam system, the method comprising:
    adjusting an inner voltage level applied to an inner electrode surrounding an opening, the inner electrode having a continuous annular planar surface extending unbroken from an inner circumference to an outer circumference in a plane of the opening; and
    adjusting at least one outer voltage level which is applied to at least one outer electrode around the inner electrode, the at least one outer electrode having a planar surface in the plane of the opening,
    wherein the inner voltage level and the at least one outer voltage levels, as applied to said electrodes, each causes an electric field that influences both a beam of electrons incident to the opening and multiple beamlets of electrons outgoing from a blanker array in the opening.

12. The method of claim 11, wherein the inner electrode has an annular planar surface with circular inner and outer perimeters.

13. The method of claim 11, wherein the inner voltage level and the at least one outer voltage level are set to correct a curvature of field in the electron-optics.

14. The method of claim 11, wherein the at least one outer electrodes comprises a plurality of outer electrodes arranged around the inner electrode.

15. The method of claim 14, wherein the plurality of outer electrodes comprises four electrodes which are arranged in quadrants around the inner electrode.

16. The method of claim 15, wherein inner voltage level and the at least one outer voltage level are set to correct a curvature of field and higher-order aberrations in the electron-optics.

17. An electron beam column comprising:
- an electron source for generating an electron beam that travels along an optical axis of the electron beam column;
- condenser electron-optics in the electron beam column for focusing and collimating the electron beam;
- an inner electrode in the electron beam column that is positioned in a pupil plane of the electron beam column and has a continuous annular shape surrounding an opening through which the electron beam is transmitted and extending unbroken from an inner circumference to an outer circumference, wherein the optical axis is normal to the pupil plane;
- at least one outer electrode positioned in the pupil plane so as to surround the inner electrode;
- a two-dimensional array positioned in the pupil plane within the opening of the inner electrode so as to receive the electron beam, wherein the two-dimensional array comprises a blanker array having pixels that are separately controlled to allow or block transmission of electron beamlets so as to form a patterned electron beam; and
- circuitry configured to apply an inner voltage level to the inner electrode and at least one outer voltage level to the at least one outer electrode.

18. The electron beam column of claim 17, further comprising:
- projection-electron optics which projects and de-magnifies the electron beam onto a surface of a target substrate.

* * * * *